United States Patent
Kang et al.

(10) Patent No.: US 8,179,176 B2
(45) Date of Patent: May 15, 2012

(54) APPARATUS FOR DETECTING JITTER OF PHASE LOCKED LOOP

(75) Inventors: Hyeong-Won Kang, Seoul (KR); Jin-Won Chung, Goyang-si (KR)

(73) Assignee: LG. Display Co., Ltd., Seoul (KR)

( * ) Notice: Subject to any disclaimer, the term of this patent is extended or adjusted under 35 U.S.C. 154(b) by 115 days.

(21) Appl. No.: 12/853,704

(22) Filed: Aug. 10, 2010

(65) Prior Publication Data

US 2011/0156780 A1    Jun. 30, 2011

(30) Foreign Application Priority Data

Dec. 31, 2009 (KR) .................. 10-2009-0135688

(51) Int. Cl.
    *H03L 7/06* (2006.01)
(52) U.S. Cl. ........................ 327/157; 327/148
(58) Field of Classification Search .................. 327/148, 327/157
    See application file for complete search history.

(56) References Cited

U.S. PATENT DOCUMENTS

| | | | |
|---|---|---|---|
| 6,831,523 B1 * | 12/2004 | Pastorello et al. | 331/25 |
| 7,999,583 B2 * | 8/2011 | Rhee et al. | 327/156 |
| 8,076,979 B2 * | 12/2011 | Kathuria et al. | 331/1 R |
| 2009/0251226 A1 * | 10/2009 | Kathuria et al. | 331/1 R |
| 2009/0302905 A1 * | 12/2009 | Rhee et al. | 327/156 |
| 2009/0302906 A1 * | 12/2009 | Rhee et al. | 327/156 |
| 2010/0052752 A1 * | 3/2010 | Lee et al. | 327/159 |
| 2011/0204944 A1 * | 8/2011 | Lee et al. | 327/159 |
| 2011/0227616 A1 * | 9/2011 | Jang et al. | 327/157 |
| 2011/0273210 A1 * | 11/2011 | Nagaraj | 327/159 |

* cited by examiner

*Primary Examiner* — Lincoln Donovan
*Assistant Examiner* — Adam Houston
(74) *Attorney, Agent, or Firm* — Brinks hofer Gilson & Lione (57) ABSTRACT

A method and apparatus for detecting jitter of a Phase Locked Loop (PLL), which is capable of detecting a jitter level of the PLL without using a separate jitter measurement device, is disclosed. The apparatus for detecting the jitter of the PLL includes the PLL configured to detect a phase difference signal between a reference clock and a feedback clock and to generate an oscillation signal having a predetermined frequency according to the phase difference signal, a variable phase delay unit configured to switch a plurality of capacitors according to an input delay control signal and to delay the phase difference signal from the PLL according to the delay control signal, a comparator configured to compare the phase difference signal from the PLL with the phase difference signal delayed by the variable phase delay unit and to detect a delay period of the phase difference signal, and a lock detection unit configured to detect whether the oscillation signal is within a lock range after the delay period detected by the comparator.

6 Claims, 7 Drawing Sheets

FIG. 4D

APPARATUS FOR DETECTING JITTER OF PHASE LOCKED LOOP

This application claims the priority and the benefit under 35 U.S.C. §119(a) on patent application Ser. No. 10-2009-0135688 filed in Republic of Korea on Dec. 31, 2009 the entire contents of which are hereby incorporated by reference.

BACKGROUND

1. Field of the Invention

The present disclosure relates to a phase locked loop circuit, and more particularly, to a method and apparatus for detecting jitter of a phase locked loop without using a separate measurement device.

2. Discussion of the Related Art

Representative examples of a flat panel display for displaying an image using digital data include a Liquid Crystal Display (LCD) using liquid crystal, a Plasma Display Panel (PDP) using discharge of inert gas, and an Organic Light Emitting Diode (OLED) display using an organic LED.

The flat panel display includes a display panel for displaying an image using a pixel matrix, a panel driver for driving the display panel, and a timing controller for controlling the panel driver. The timing controller uses clocks for data input/output or various signal processing functions and includes a Phase Locked Loop (PLL) circuit in order to generate internal clocks synchronized with external clocks. The PLL circuit as well as the timing controller is necessarily used in a plurality of electronic circuits using clocks.

When an electronic circuit having a PLL circuit built-in therein is tested, a clock jitter amount of the PLL circuit is detected so as to judge the reliability of the circuit or to judge jitter stability of a receiver circuit. However, in the related art, since the jitter amount of the PLL circuit built-in the electronic circuit is detected using a separate jitter measurement device, a test process was not efficient.

BRIEF SUMMARY

An apparatus for detecting jitter of a Phase Locked Loop (PLL) includes a PLL configured to detect a phase difference signal between a reference clock and a feedback clock and to generate an oscillation signal having a predetermined frequency according to the phase difference signal, a variable phase delay unit configured to switch a plurality of capacitors according to an input delay control signal and to delay the phase difference signal from the PLL according to the delay control signal, a comparator configured to compare the phase difference signal from the PLL with the phase difference signal delayed by the variable phase delay unit and to detect a delay period of the phase difference signal, and a lock detection unit configured to detect whether the oscillation signal is within a lock range after the delay period detected by the comparator.

In another aspect, a method for detecting jitter of a Phase Locked Loop (PLL) includes detecting a phase difference signal between a reference clock and a feedback clock so as to generate an oscillation signal having a predetermined frequency according to the phase difference signal, switching a plurality of capacitors according to an input delay control signal so as to delay the phase difference signal according to the delay control signal, comparing the phase difference signal and the delayed phase difference signal so as to detect a delay period of the phase difference signal, and generating a lock detection signal indicating whether the oscillation signal is within a lock range after the detected delay period.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE DRAWINGS AND THE PRESENTLY PREFERRED EMBODIMENTS

Reference will now be made in detail to the embodiments of the present invention, examples of which are illustrated in the accompanying drawings.

Figure 1:
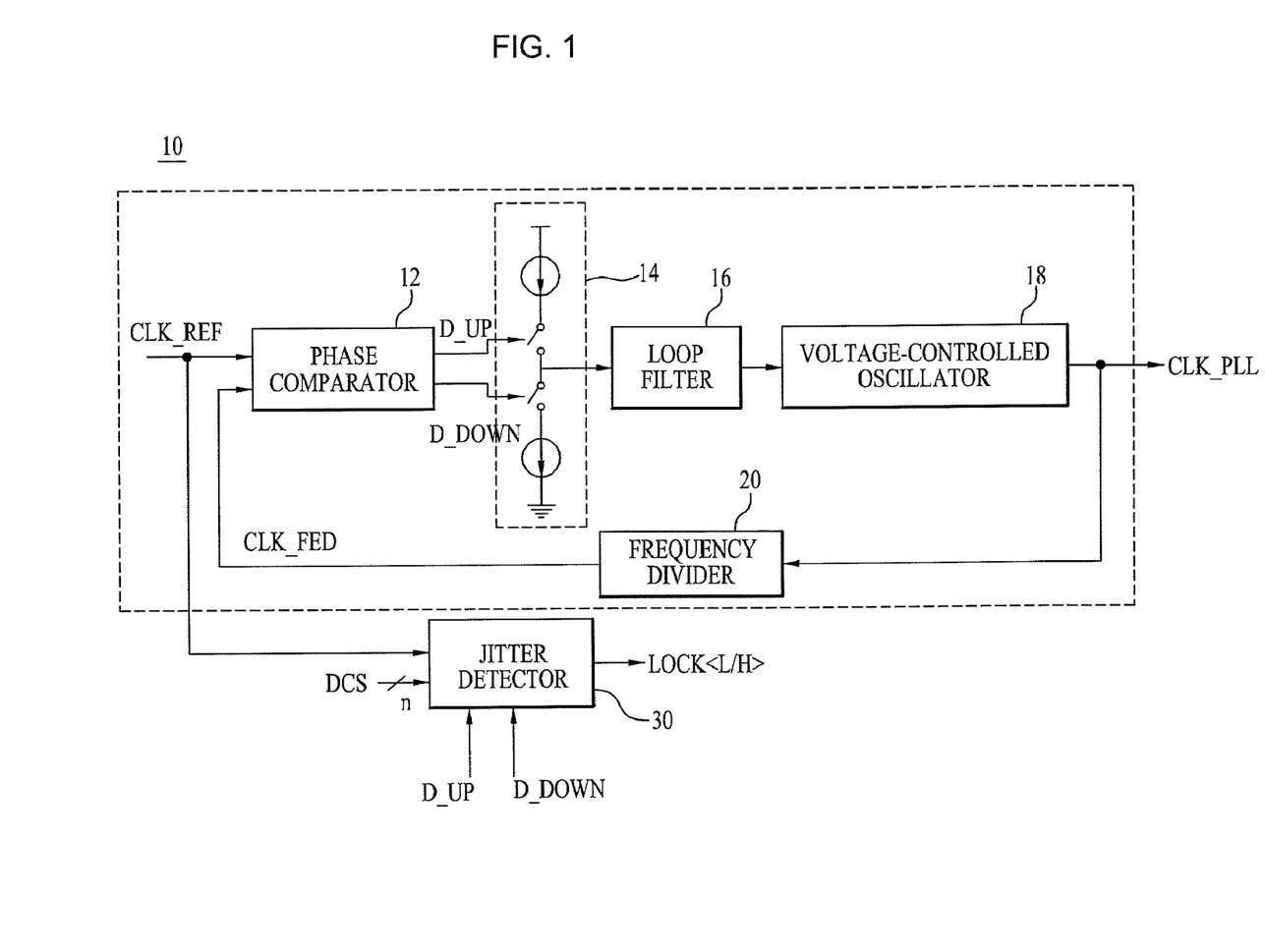
FIG. 1 is a schematic block diagram showing an apparatus for detecting jitter of a Phase Locked Loop (PLL) according to an embodiment of the present invention.
Figure 2:
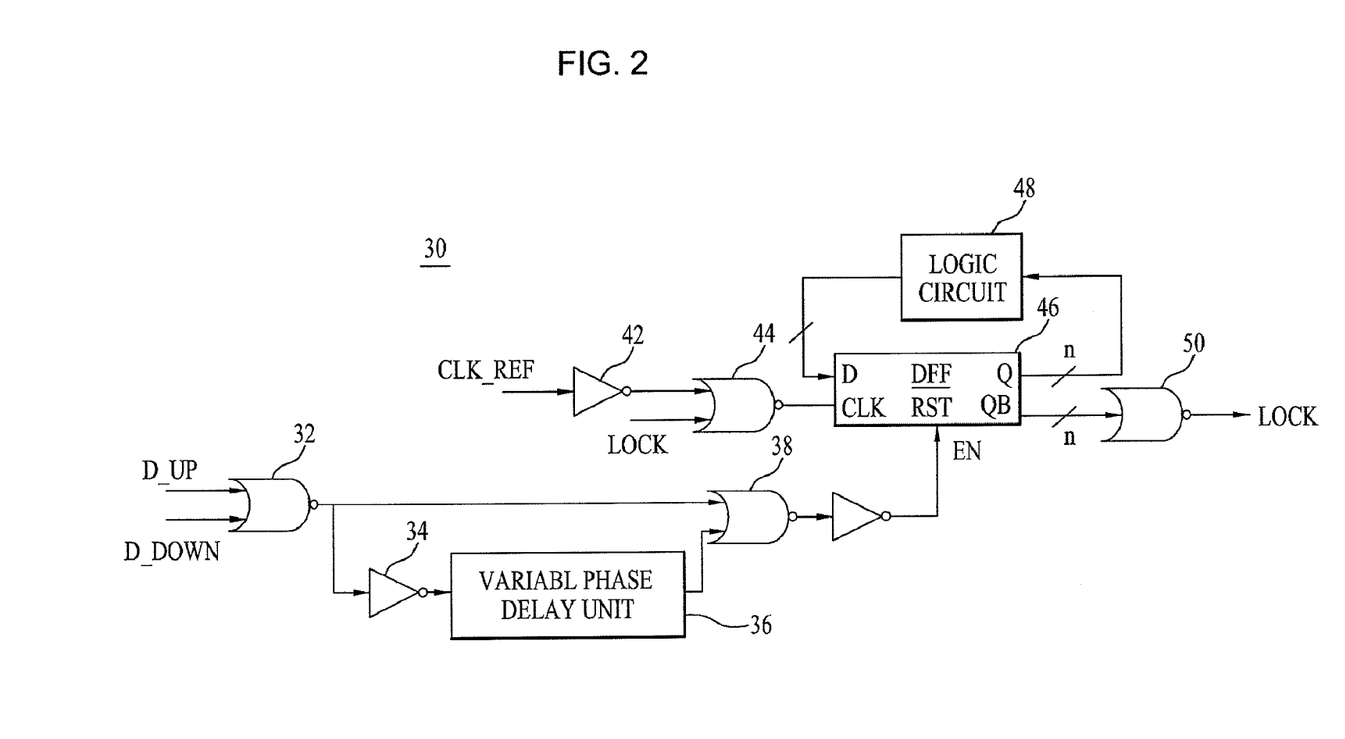
FIG. 2 is a circuit diagram showing the detailed configuration of a jitter detection unit shown in FIG. 1.

FIG. 1 is a schematic block diagram showing an apparatus for detecting jitter of a Phase Locked Loop (PLL) according to an embodiment of the present invention, and FIG. 2 is a circuit diagram showing the internal configuration of a jitter detection unit shown in FIG. 1.

The apparatus for detecting the jitter of the PLL shown in FIG. 1 includes a PLL 10 including a phase comparator 12, a charge pump unit 14, a loop filter 16, a voltage-controlled oscillator 18 and a frequency divider 20, and a jitter detection unit 30 for artificially delaying phase difference signals D_UP and D_DOWN from the phase comparator 12 of the PLL 10 according to a delay control signal DCS and detecting whether an oscillation signal is within a lock range.

The phase comparator 12 compares the phase of an externally input reference clock CLK_REF with the phase of a feedback clock CLK_FED from the frequency divider 20 and generates the phase difference signals, that is, an up detection signal D_UP and a down detection signal D_DOWN. If the phase of the feedback clock CLK_FED is delayed with respect to the phase of the reference clock CLK_REF, the phase comparator 12 generates and outputs the up detection signal D_UP corresponding to the phase difference. If the phase of the reference clock CLK_REF is delayed with respect to the phase of the feedback clock CLK_FED is delayed, the phase comparator 12 generates and outputs the down detection signal D_DOWN corresponding to the phase difference.

The charge pump unit 14 performs a positive charge pumping operation in response to the up detection signal D_UP output from the phase comparator 12 to supply charges to the loop filter 16 and performs a negative charge pumping operation in response to the down detection signal D_DOWN to discharge the loop filter 16.

The loop filter 16 generates an oscillation control voltage corresponding to the charges charged or discharged by the charge pump unit 14 and outputs the oscillation control voltage to the voltage-controlled oscillator 18. If the charges are charged by the charge pump unit 14, the oscillation control voltage rises and, if the charges are discharged by the charge pump unit 14, the oscillation control voltage drops. Accordingly, the charge pump unit 14 and the loop filter 16 generate and output the oscillation control voltage corresponding to the phase difference signal D_UP or D_DOWN from the phase comparator 12.

The voltage-controlled oscillator 18 generates and outputs a PLL clock CLK_PLL having a predetermined frequency in correspondence with the oscillation control voltage output from the loop filter 16.

The frequency divider 20 divides the PLL clock CLK_PLL fed back from the voltage-controlled oscillator 18 by a predetermined division ratio, and generates and feeds back the feedback clock CLK_FED to the phase comparator 12.

The PLL 10 repeats the above operation and generates and outputs the PLL clock CLK_PLL which is synchronized with the reference clock CLK_REF, whose phase is locked.

The jitter detection unit 30 artificially delays the phase difference signals D_UP and D_DOWN output from the phase comparator 12 according to the delay control signal DCS, detects whether the oscillation signal of the PLL is within the lock range, and outputs a lock detection signal LOCK. Then, a designer may judge a jitter level within the lock range of the PLL 10 by referring to a delay amount set as the delay control signal DCS, that is, a jitter amount, according to the output of the lock detection signal LOCK.

As shown in FIG. 2, the jitter detection unit 30 includes a variable phase delay unit 36 for delaying the phase difference signals D_UP and D_DOWN from the phase comparator 12 according to the delay control signal DCS, a comparator 38 for comparing the phase difference signals D_UP and D_DOWN from the phase comparator 12 with the delayed signal and generating and outputting an unlock signal corresponding to a delay period, that is, an enable signal EN, and a lock detection unit 46 for outputting the lock detection signal LOCK in response to the enable signal from the comparator 38.

The phase difference signals, that is, the up detection signals D_UP and the down detection signal D_DOWN, from the phase comparator 12 are input to the variable phase delay unit 36 via a NOR gate 32 and an inverter 34. The delay control signal DCS is stored in a register as a predetermined phase delay amount, that is, a jitter amount, which is set by the designer in advance. The variable phase delay unit 36 switches a plurality of capacitors according to the n-bit delay control signal DCS so as to control a phase delay amount.

Figure 3:
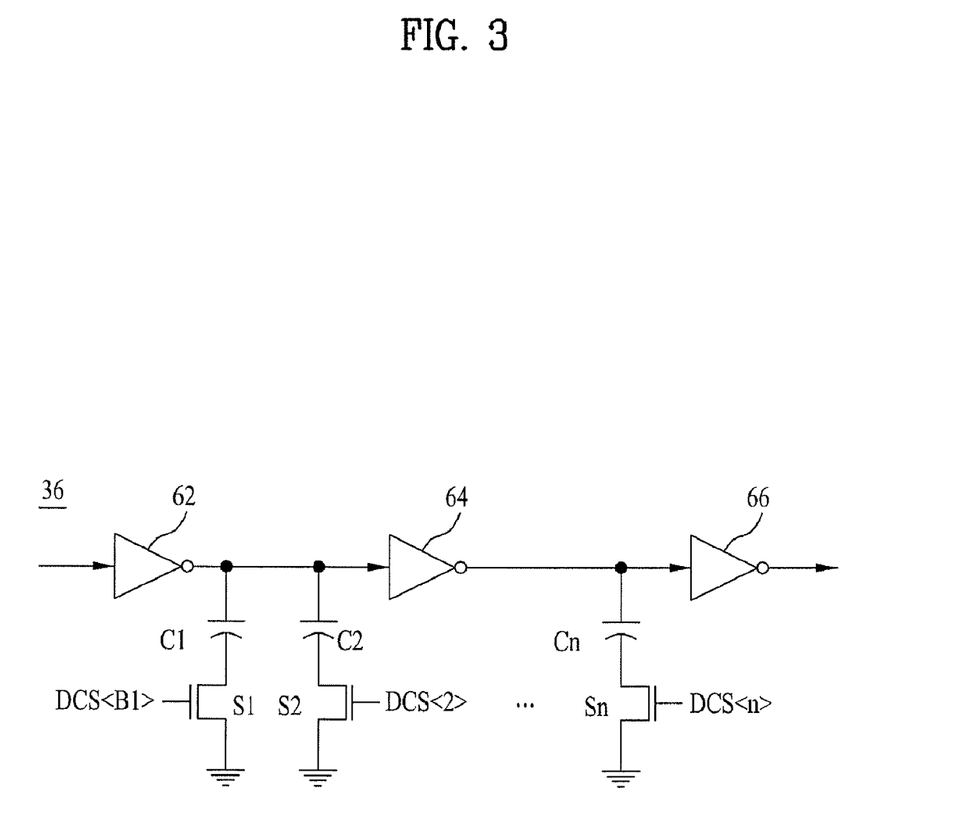
FIG. 3 is a circuit diagram showing the detailed configuration of a variable phase delay unit shown in FIG. 2.

As shown in FIG. 3, the variable phase delay unit 36 includes a capacitor delay unit including a plurality of inverter buffers 62, 64 and 66 connected to an input/output line in series, a plurality of capacitors C1 to Cn connected to a connection line of the plurality of inverter buffers 62, 64 and 66 in parallel, and a plurality of switches S1 to Sn switched by bits B1 to Bn of the n-bit delay control signal DCS so as to selectively connect the plurality of capacitors C1 to Cn to the connection line of the plurality of inverter buffers 62, 64 and 66. The input signal is delayed in proportion to the number of capacitors C1 to Cn connected to the plurality of inverter buffers 62, 64 and 66 in parallel according to the bits B1 to Bn of the delay control signal DCS, and the delayed signal is output. Accordingly, the variable phase delay unit 36 delays the phase difference signals D_UP and D_DOWN input through the NOR gate 32 and the inverter 34 by the delay amount set as the delay control signal DCS and outputs the delayed signals. In addition, the variable phase delay unit 36 may vary the phase delay time as necessary by adjusting unit capacitor ratios C1 to Cn.

The NOR gate 38 which is the comparator compares the up and down detection signals D_UP and D_DOWN input through the NOR gate 32 with the signals delayed by the variable phase delay unit 36, detects the unlock period, that is, the delayed period, in which both the signals overlap each other, generates the enable signal EN, and outputs the enable signal EN to the lock detection unit 46 through an inverter 40.

The lock detection unit 46 which is a D flip-flop is driven in response to the enable signal EN supplied from the comparator 38 to a reset terminal RST such that an output terminal Q thereof outputs "1" and an inverted output terminal QB outputs "0" if an input signal of an input terminal D is "1". Then, a NOR gate 50 outputs the lock detection signal of "1". The output of the output terminal Q is fed back to the input terminal D through a logic circuit 48. A NOR gate 44 connected to a clock terminal CLK compares the reference clock CLK_REF input through an inverter 42 with the lock detection signal LOCK and outputs "0" to the clock terminal CLK if the lock detection signal LOCK is in a lock state ("1") so as to stop the operation of the lock detection unit 46 and to maintain the lock output LOCK. Accordingly, the lock detection unit 46 outputs the lock detection signal LOCK indicating whether the oscillation signal of the PLL is within the lock range after being delayed by the enable period (that is, by the delay period) from the reference clock CLK_REF while the PLL 10 performs the lock operation, in response to the enable signal EN according to the artificial delay period of the phase difference signal.

The jitter detection unit 30 artificially delays the phase difference signals D_UP and D_DOWN from the phase comparator 12 according to the delay control signal DCS and generates and outputs the lock detection signal LOCK indicating whether the oscillation signal of the PLL is within the lock range after being delayed by the delay time. Accordingly, the designer may judge a jitter level within the lock range of the PLL 10 by referring to the delay amount set as the delay control signal DCS, that is, the jitter amount, according to the output of the lock output signal LOCK.

Figure 4A:
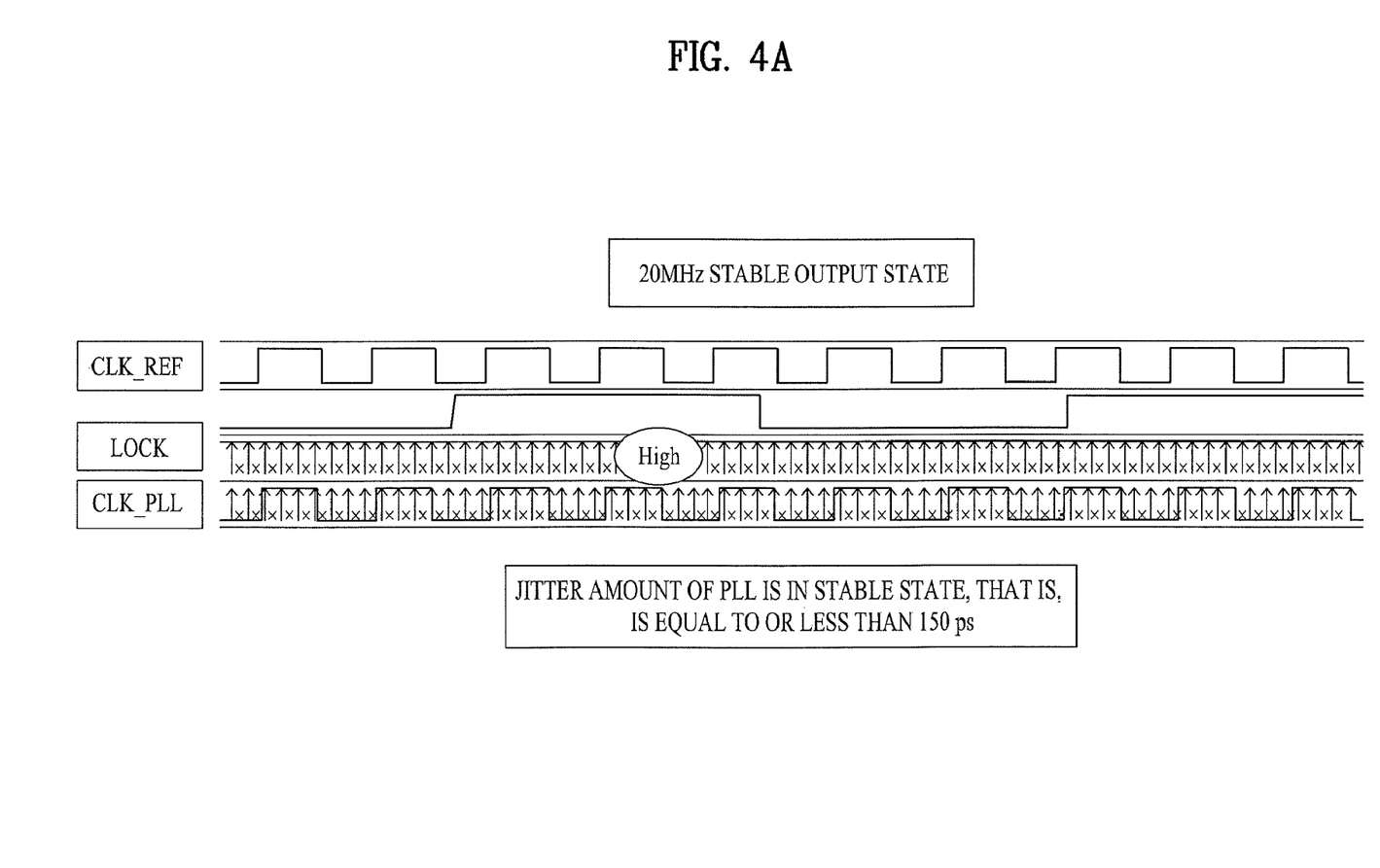
FIGS. 4A to 4D are test waveform diagrams showing jitter amounts according to a lock detection signal output from the apparatus for detecting the jitter of the PLL according to the present invention.
Figure 4B:
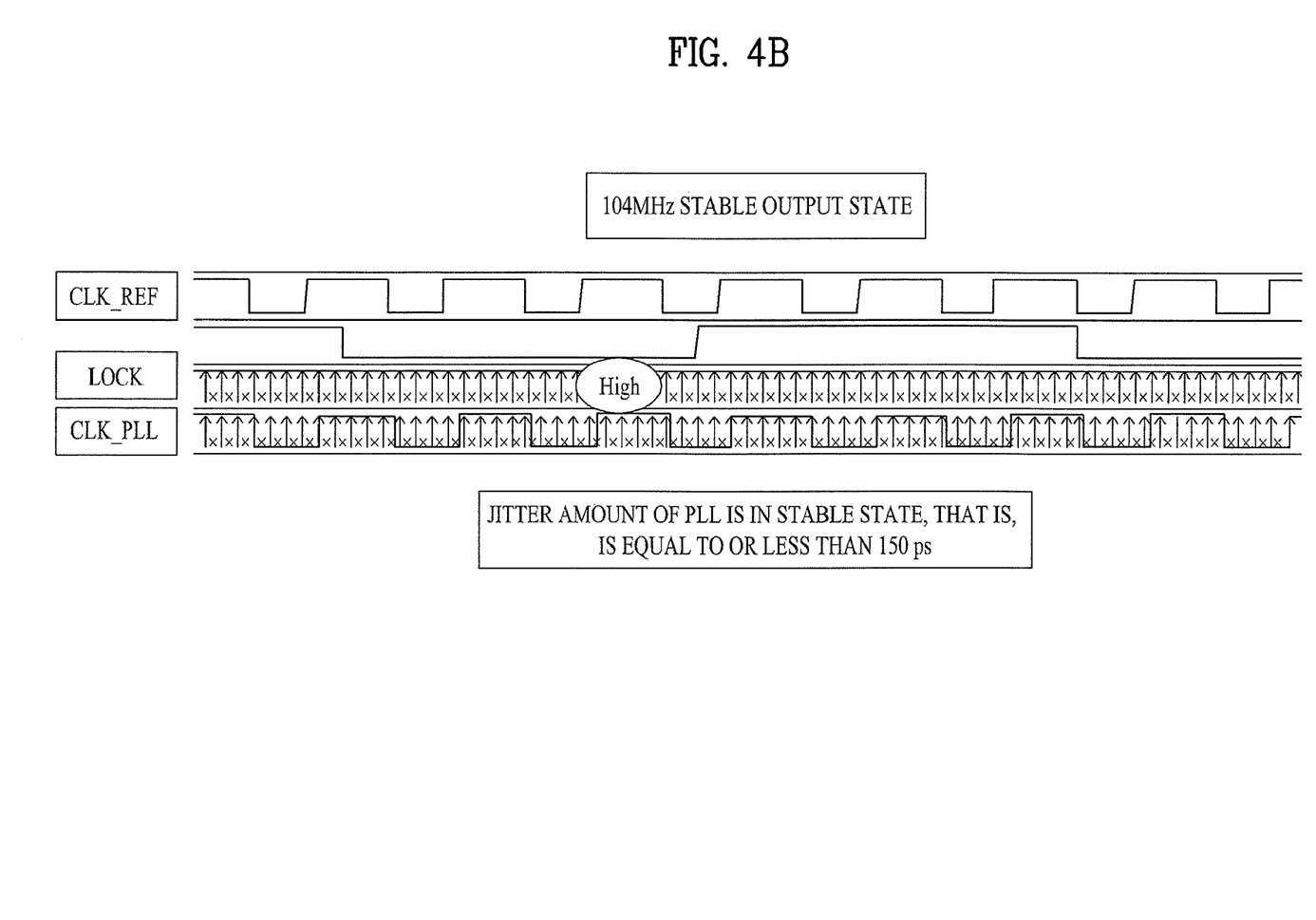
Figure 4C:
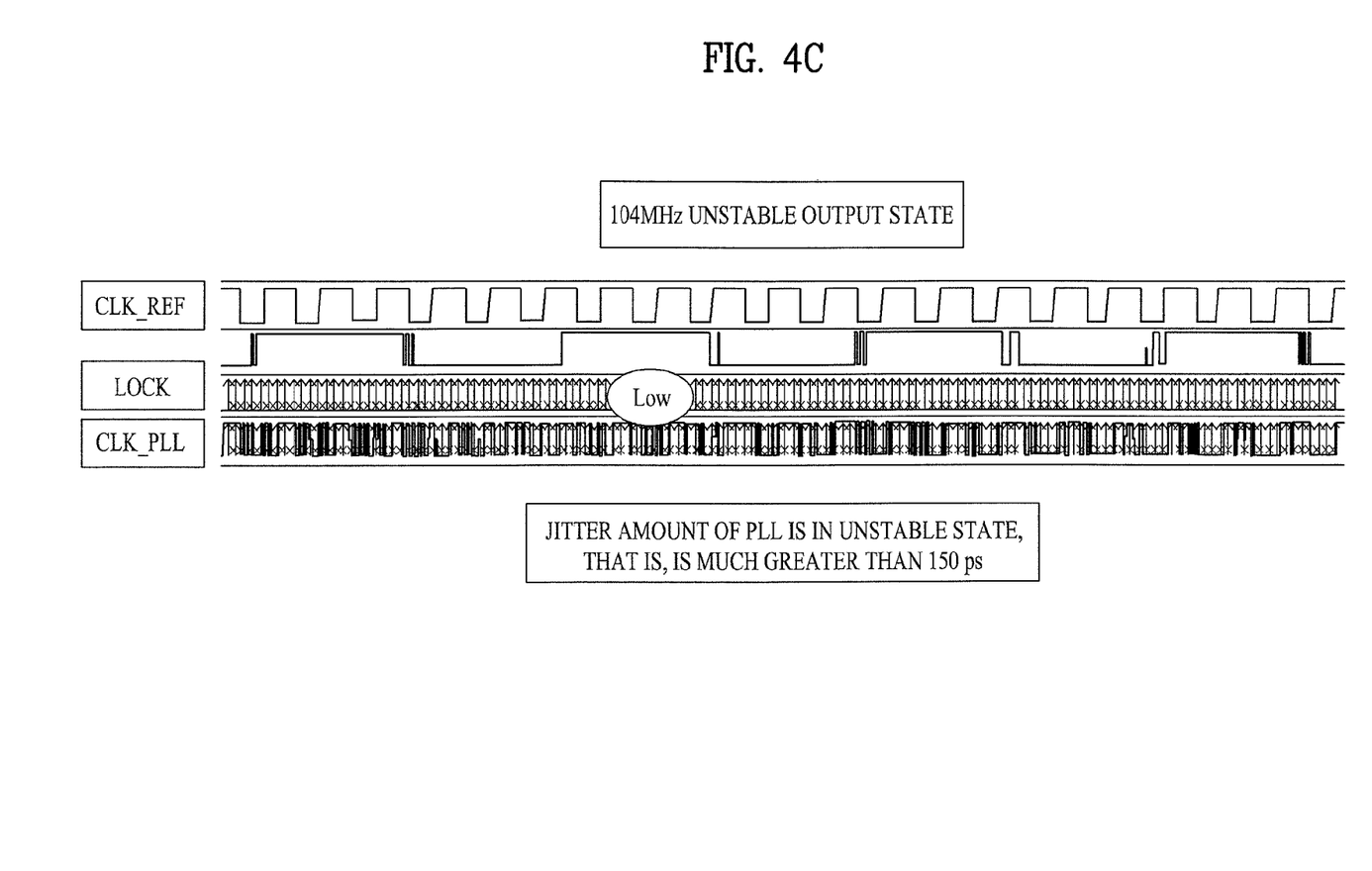

FIGS. 4A to 4C are test waveform diagrams showing the PLL clock PLL_CLK and the lock detection signal LOCK according to the frequency of the PLL clock PLL_CLK if the delay control signal DCS is set to 150 ps in the apparatus for detecting the jitter of the PLL according to the embodiment of the present invention.

Figure 4D:
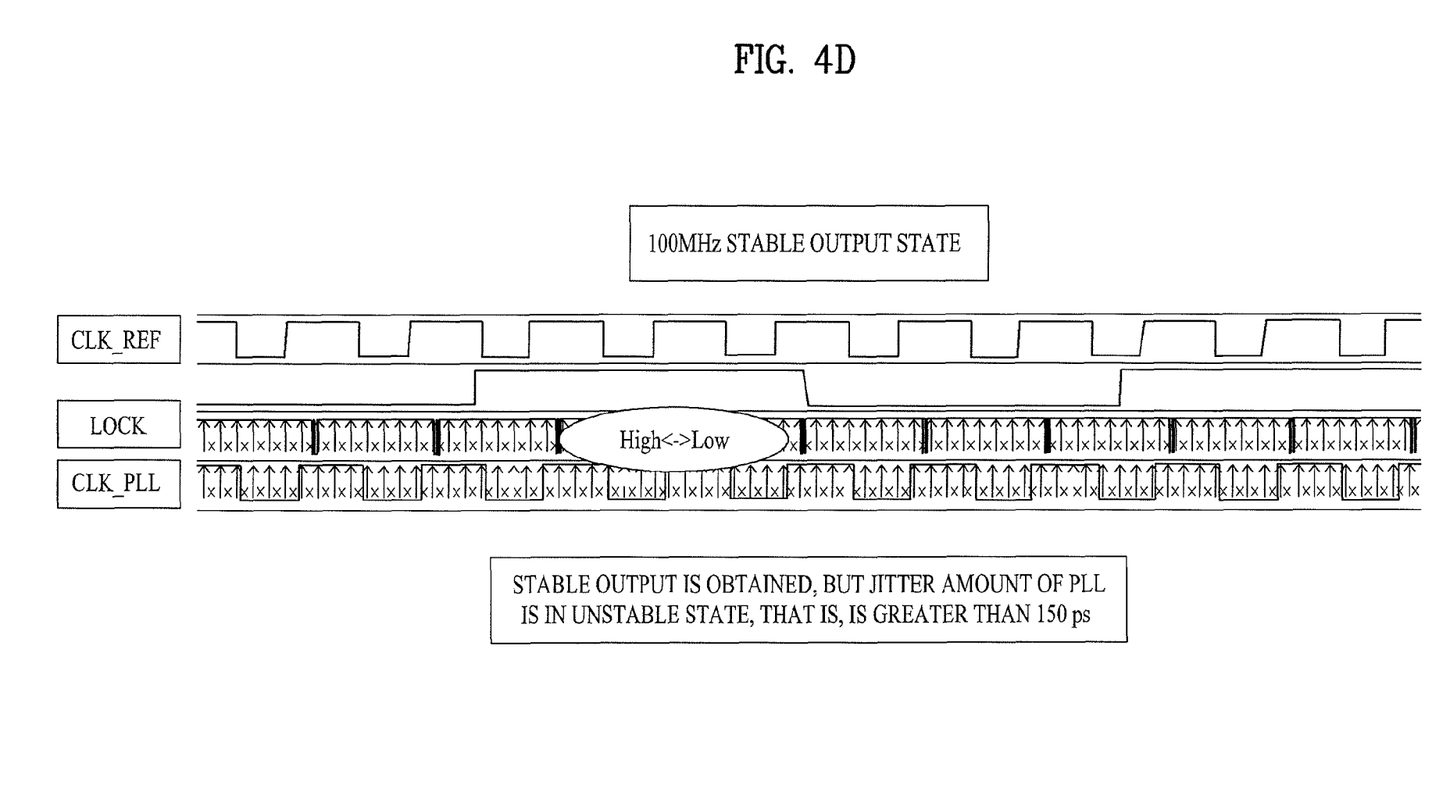

Referring to FIGS. 4A and 4B, since the PLL 10 stably outputs PLL clocks CLK_PLL having frequencies of 20 MHz and 104 MHz and the lock detection signal LOCK is stably output in a high state, it can be seen that the jitter amount of the PLL 10 is in a stable state, that is, is equal to or less than 150 ps which is set as the delay control signal DCS. In contrast, referring to FIG. 4C, since the PLL clock CLK_PLL having a frequency of 104 MHz is unstably output and the lock detection signal LOCK is in a low state, that is, in an unstable state, it can be seen that the jitter amount of the PLL 10 is in the unstable state, that is, is much greater than 150 ps which is set as the delay control signal DCS. Referring to FIG. 4D, since the PLL 10 stably outputs the PLL clock CLK_PLL having a frequency of 100 MHz but the lock detection signal LOCK is alternately in the high state and the low state, the jitter amount of the PLL 10 is greater than 150 ps which is set as the delay control signal DCS.

According to the present invention, by artificially adjusting the lock range using the delay control signal DCS of the capacitor delay unit, it is possible to efficiently judge the jitter level without using an additional jitter detection device. According to the present invention, by adjusting the phase delay using the capacitor delay unit, it is possible to detect whether the oscillation signal of the PLL is within the lock range. According to the present invention, by adjusting the unit capacitor ratios, it is possible to adjust the phase delay time as necessary. According to the present invention, since the jitter level is judged by a simple structure using the capacitor delay unit, a signal generator can test jitter stability of a receiver and thus test time can be reduced. It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

The invention claimed is:

1. An apparatus for detecting jitter of a Phase Locked Loop (PLL), the apparatus comprising:
    the PLL configured to detect a phase difference signal between a reference clock and a feedback clock and to generate an oscillation signal having a predetermined frequency according to the phase difference signal;
    a variable phase delay unit configured to switch a plurality of capacitors according to an input delay control signal and to delay the phase difference signal from the PLL according to the delay control signal;
    a comparator configured to compare the phase difference signal from the PLL with the phase difference signal delayed by the variable phase delay unit and to detect a delay period of the phase difference signal; and
    a lock detection unit configured to detect whether the oscillation signal is within a lock range after the delay period detected by the comparator.

2. The apparatus according to claim 1, wherein the variable phase delay unit includes:
    a plurality of inverter buffers connected to an input/output line in series;
    a plurality of capacitors connected to a connection line of the plurality of inverter buffers in parallel; and
    a plurality of switches configured to switch the plurality of capacitors in response to bits of the delay control signal.

3. The apparatus according to claim 1, wherein whether the phase difference signal delayed by the delay control signal is within the lock range is detected.

4. A method for detecting jitter of a Phase Locked Loop (PLL), the method comprising:
    detecting a phase difference signal between a reference clock and a feedback clock so as to generate an oscillation signal having a predetermined frequency according to the phase difference signal;
    switching a plurality of capacitors according to an input delay control signal so as to delay the phase difference signal according to the delay control signal;
    comparing the phase difference signal and the delayed phase difference signal so as to detect a delay period of the phase difference signal; and
    generating a lock detection signal indicating whether the oscillation signal is within a lock range after the detected delay period.

5. The method according to claim 4, wherein the plurality of capacitors is switched in response to bits of the delay control signal so as to determine the delay period of the phase difference signal.

6. The method according to claim 4, wherein whether the phase difference signal delayed by the delay control signal is within the lock range is detected.

* * * * *